(12) United States Patent
Schulz et al.

(10) Patent No.: US 9,599,731 B2
(45) Date of Patent: Mar. 21, 2017

(54) POSITRON EMISSION TOMOGRAPHY AND/OR SINGLE PHOTON EMISSION TOMOGRAPHY DETECTOR

(71) Applicant: KONINKLIJKE PHILIPS ELECTRONICS N. V., Eindhoven (NL)

(72) Inventors: Volkmar Schulz, Aachen (DE); Andre Frank Salomon, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 614 days.

(21) Appl. No.: 13/803,227

(22) Filed: Mar. 14, 2013

(65) Prior Publication Data

US 2014/0264041 A1 Sep. 18, 2014

(51) Int. Cl.
*G01R 33/02* (2006.01)
*G01T 1/29* (2006.01)
*G01R 33/48* (2006.01)
*G01T 1/16* (2006.01)
*G01T 1/24* (2006.01)

(52) U.S. Cl.
CPC .......... *G01T 1/2985* (2013.01); *G01R 33/481* (2013.01); *G01T 1/1603* (2013.01); *G01T 1/243* (2013.01)

(58) Field of Classification Search
CPC ................................................... G01R 33/481
USPC ........... 250/363.01, 363.04, 370.09; 600/411
See application file for complete search history.

(56) References Cited

U.S. PATENT DOCUMENTS

| 4,454,424 | A | * | 6/1984 | Strauss et al. ............ 250/390.11 |
| 4,743,764 | A | * | 5/1988 | Casey ................... G01T 1/2985 |
| | | | | 250/363.03 |
| 7,218,112 | B2 | * | 5/2007 | Ladebeck et al. ............ 324/318 |
| 2008/0068017 | A1 | * | 3/2008 | Eberler et al. ................ 324/318 |
| 2008/0116387 | A1 | | 5/2008 | Astley et al. |
| 2010/0219349 | A1 | * | 9/2010 | Furuichi ............... G01T 1/2018 |
| | | | | 250/366 |

(Continued)

FOREIGN PATENT DOCUMENTS

| CA | 2077735 A1 | 3/1994 |
| GB | 2175780 A | 12/1986 |

(Continued)

OTHER PUBLICATIONS

Lee et al., "Planar Strip Array (PSA) for MRI," Magn. Reson Med. Apr. 2001; 45(4): pp. 673-683; Retrieved from Internet [Apr.19, 2016]; Retrieved from url <http://www.ncbi.nlm.nih.gov/pmc/aricles/PMC1941687>.*

(Continued)

*Primary Examiner* — Yara B Green

(57) ABSTRACT

An imaging system includes a magnetic resonance portion that produces an electric field and a second imaging portion, including a detector with a two dimensional array of detector tiles, wherein adjacent tiles along an axial direction are spaced apart by an electrically conductive material, which shields the tiles from the electric field. An imaging system includes a first imaging portion having a detector, which includes an array of scintillation crystals and a photo-sensor coupled to the array of scintillation crystals, wherein an output of the photo-sensor includes a unique ratio of information that identifies each crystal.

14 Claims, 6 Drawing Sheets

(56) References Cited

U.S. PATENT DOCUMENTS

| | | | |
|---|---|---|---|
| 2010/0260409 A1* | 10/2010 | Ben-Levy | 382/141 |
| 2010/0288938 A1* | 11/2010 | Platzgummer | 250/396 R |
| 2011/0288401 A1* | 11/2011 | Solf et al. | 600/411 |
| 2012/0330128 A1* | 12/2012 | Park | A61B 6/037 600/411 |
| 2013/0026380 A1 | 1/2013 | Tkaczyk et al. | |
| 2013/0211233 A1* | 8/2013 | Yamaya | A61B 5/055 600/411 |
| 2014/0221814 A1* | 8/2014 | Ryu | G01R 33/481 600/411 |

FOREIGN PATENT DOCUMENTS

| | | | |
|---|---|---|---|
| WO | 2008084438 | A2 | 7/2008 |
| WO | 2009013650 | A2 | 1/2009 |

OTHER PUBLICATIONS

Jan, S., et al.; GATE-Geant4 Application for Tomographic Emission: a simulation toolkit for PET and SPECT; 2004; Phys. Med. Biol.; 49(19)4543-4561.

Shepp, L. A., et al.; Maximum likelihood reconstruction for emission tomography; 1982; IEEE Trans. on Medical Imaging; vol. 1; pp. 113-122.

\* cited by examiner

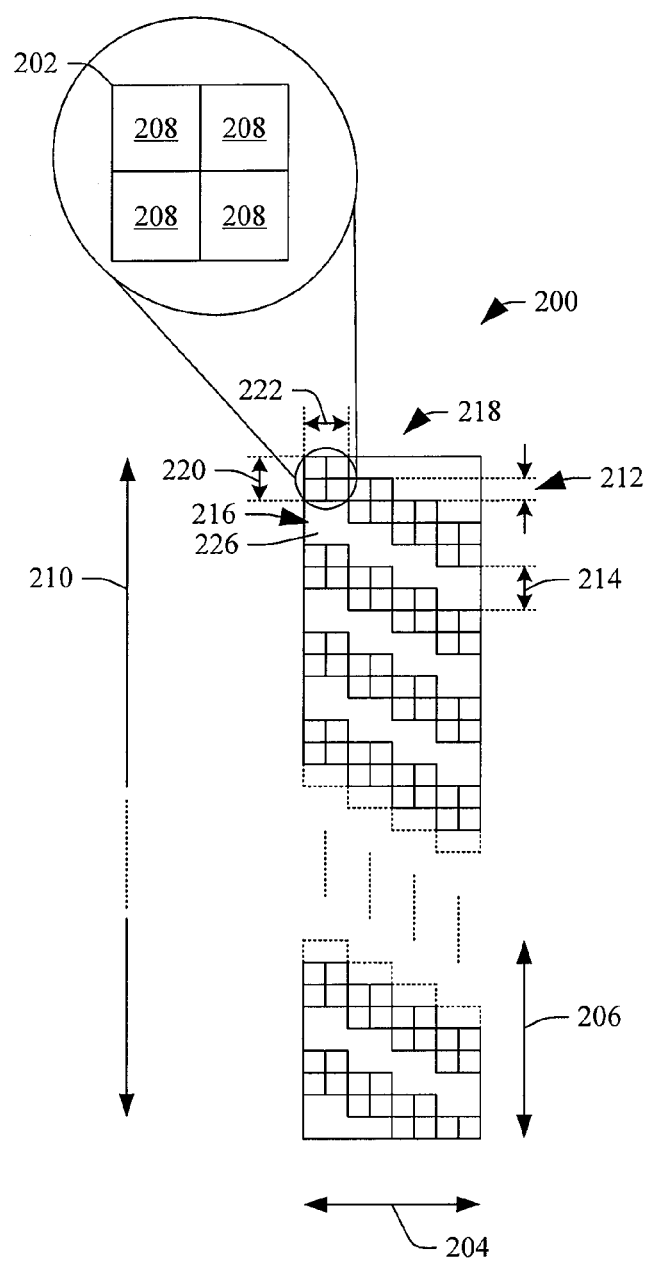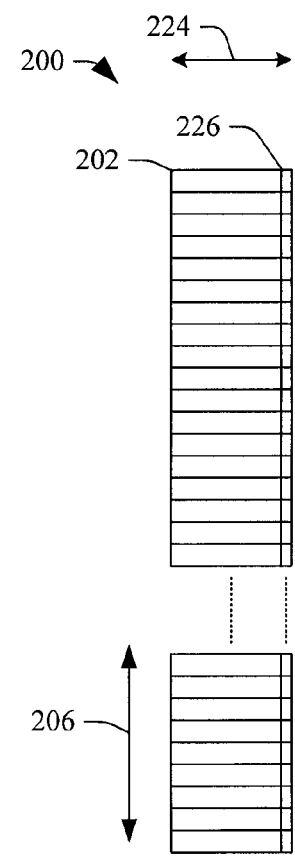
FIGURE 2
FIGURE 3

POSITRON EMISSION TOMOGRAPHY AND/OR SINGLE PHOTON EMISSION TOMOGRAPHY DETECTOR

The following generally relates to imaging and more particularly to positron emission tomography (PET) and/or single photon emission tomography (SPECT) imaging, and is described herein with particular application to a PET/MR (magnetic resonance); however, the following is also amenable to a PET scanner, a SPECT scanner, a PET/CT (computed tomography) scanner, a SPECT/MR scanner, a SPECT/CT, SPECT/PET, and/or other PET and/or SPECT based scanner.

Integrating positron emission tomography (PET) and magnetic resonance (MR) imaging combines the high sensitive functional diagnostics of PET and the high resolution and tissue contrast of MR. However, to combine such technologies into a single integrated scanner, the PET portion needs to be neutral to the magnetic and high fields generated by the magnet and high field coils of the MR portion during scanning with the MR portion. Photomultiplier tubes (PMTs) generally are highly affected by magnetic fields and have been replaced by avalanche photodiodes (APDs) or silicon photomultipliers (SiPMs). Shielding of the PET detector modules against HF signals has been achieved by a copper housing. Unfortunately, the copper housings that have been used can cause additional absorption and scattering of 511 keV-photons, thereby diminishing sensitivity and resolution.

To achieve high resolution in preclinical PET or PET/MR, the pixelated crystal arrays have been combined with a light guide readout to the SiPM arrays, forming a very powerful PET detector block. In this concept, the essential function of the light guide is to distribute the light emitted by the crystals over a regular grid of the SiPM array, which allows for identifying crystals much smaller than the SiPM pixels. Unfortunately, especially at the edges of such a detector block, homogeneous light guides leads to insufficient identification of these crystals, which ends up in a degradation of the overall PET image resolution. On the other hand, a one to one (1:1) coupling between the crystals and the SiPM array pixels requires a large number of channels and a high density of readout electronics.

In view of at least the above, there is an unresolved need for other approaches for shielding and/or achieving high resolution in connection with a PET detector of a PET, PET/MR, and/or other PET based scanner.

Aspects of the present application address the above-referenced matters, and others.

In one aspect, an imaging system includes a magnetic resonance portion that produces an electric field and a second imaging portion that includes a detector with a two dimensional array of detector tiles, wherein adjacent tiles along an axial direction are spaced apart by an electrically conductive material, which shields the tiles from the electric field.

In another aspect, an imaging system includes a first imagingportion having a detector which includes an array of scintillation crystals and a photo-sensor coupled to the array of scintillation crystals, wherein an output of the photo-sensor includes a unique ratio of information that identifies each crystal.

In another aspect, a method includes configuring a scanner with a detector that includes at least one of a two dimensional array of detector tiles, wherein adjacent tiles along an axial direction are spaced apart by an electrically conductive material, which shields the tiles from electric fields, or an array of scintillation crystals and a photo-sensor having a plurality of sensor channels, wherein the crystals are directly coupled to the photo-sensor, and a unique ratio of triggered channels identifies each crystal.

Still further aspects of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

The invention may take form in various components and arrangements of components, and in various steps and arrangements of steps. The drawings are only for purposes of illustrating the preferred embodiments and are not to be construed as limiting the invention.

FIG. 1 schematically illustrates an example imaging system including a PET detector.

FIG. 2 schematically illustrates an example of the PET detector of FIG. 1, looking into the radiation sensitive surface.

FIG. 3 schematically illustrates a side view of the example detector of FIG. 2.

FIGS. 4-7 schematically illustrate examples of 1D sensitivity patterns for the sensor channels of the PET detector of FIG. 1.

FIGS. 8-11 schematically illustrate examples of 2D sensitivity patterns for the sensor channels of the PET detector of FIG. 1.

FIG. 12 schematically illustrates an example 3D sensitivity pattern for the sensor channels of the PET detector of FIG. 1.

The following relates to PET and/or SPECT scanners, including individual scanners and combination scanners such as, but not limited to, PET/MR, PET/CT, PET/MR and/or SPECT/CT, SPECT/PET and/or other PET and/or SPECT based scanners. However, for sake of brevity and explanatory purposes, the following will be described in the context of a PET/MR scanner.

Figure 1:
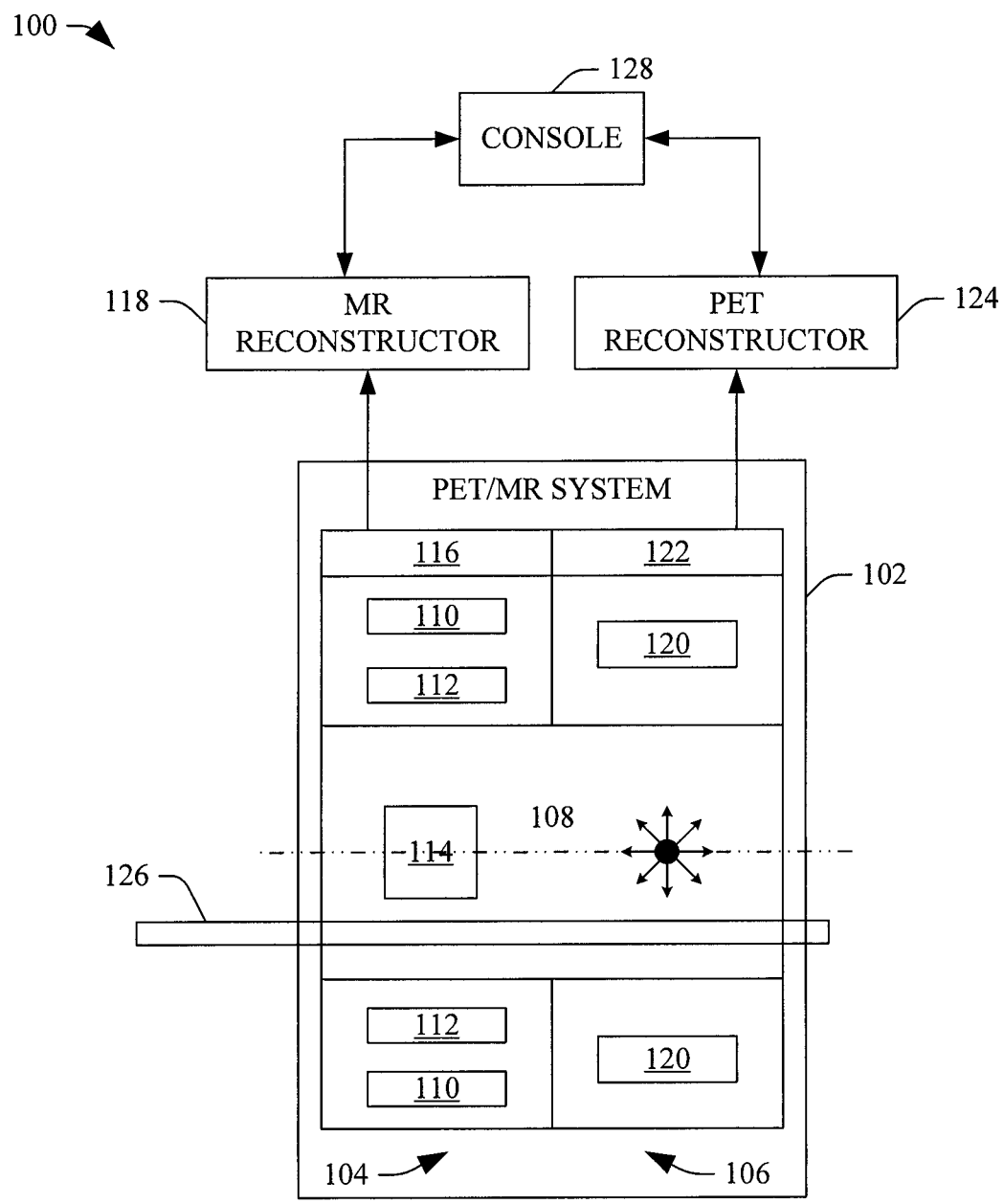

FIG. 1 schematically illustrates a single imaging system 100 that includes a gantry 102 with both an MR (magnetic resonance) gantry portion 104 and a positron emission tomography (PET) gantry portion 106, which share a single examination region 108. In another embodiment, the PET and MR gantry portions 104 and 106 are respectively part of separate PET and MR imaging scanners in the same examination room or different examination rooms.

The MR gantry portion 104 includes a main magnet 110, gradient (x, y, and z) coils 112, and a RF coil 114. The main magnet 110 (which can be a superconducting, resistive, permanent, or other type of magnet) produces a substantially homogeneous, temporally constant main magnetic field $B_0$ in the examination region 108. The gradient coils 112 generate time varying gradient magnetic fields along the x, y, and z-axes of the examination region 108. The RF coil 114 includes a transmit portion that produces radio frequency signals (at the Larmor frequency of nuclei of interest (e.g., hydrogen, etc.)) that excite the nuclei of interest in the examination region 108 and a receive portion that detects MR signals emitted by the excited nuclei. In other embodiments, the transmit portion and the receive portion of the RF coil 114 are located in separate RF coils. A MR data acquisition system 116 processes the MR signals, and a MR reconstructor 118 reconstructs the data and generates MR images.

The PET gantry portion 106 includes a gamma ray radiation sensitive detector array 120 disposed about the examination region 108. The detector array 120 includes one or more scintillation crystals and corresponding photo-sensors, such as (analog or digital) silicon photomultipliers (SiPMs), avalanched photodiodes (APDs), etc. The crystals produce light when struck by a gamma ray, and the photo-sensors receive the light and generate electrical signals indicative thereof. A PET data acquisition system 122 processes the signals and generates PET data. In one instance, the PET data includes a list of annihilation events detected during data acquisition. The list generally includes, for each entry, information such as a time at which the event was detected, a position and orientation of the corresponding line-of-response (LOR), etc. The PET portion 102 is configured with at least one of depth of interaction (DoI) or time-of-flight (TOF) capabilities. A PET reconstructor 124 reconstructs the PET data and generates PET images. The PET reconstructor 124 employs reconstruction software, which includes a suitable reconstruction algorithm, such as, a ML-EM (maximum likelihood-expectation maximization), an OS-EM (ordered subset expectation maximization), and/or other algorithm.

Although the MR reconstructor 118 and the PET reconstructor 124 are shown as separate components, it is to be appreciated that they can be part of a same reconstructor and/or other component.

As described in greater detail below, in one example, the detector crystals are grouped into tiles, which are physically configured with respect to each other in a sparse arrangement with gaps between crystals along a length of the detector and electrically conductive material in the gaps. In one instance, the electrically conductive material shields the crystals from external electric fields such as the high field generated by the MR portion 104. Such shielding can mitigate the influence of the high field on the PET detector electronics, without diminishing the sensitivity and spatial resolution of the detector. In addition, the sparse arrangement provides for additional space for the bonding between photo-sensors and detector electronics. Also described in greater detail below, additionally or alternatively, the crystal array can be optically coupled to the photo-sensors, without the use of a light guide, via a sensitivity pattern of the photo-sensor channels which is structured such that identification of each crystal is through a unique ratio of the triggered channels. This allows for homogeneous crystal identification for PET across the detector block, even at the edges, and identifying n crystals using k channel (where k<n) and, thus, fewer (k) readout channels can be used on the readout electronic.

A subject support 126 supports a subject such as a human or animal subject in the examination region 106. The support 126 is longitudinally movable in coordination with operation of the PET/MR system 100 so that the subject can be scanned at a plurality of longitudinal locations by one or both of the PET and MR gantry portions 106 and 104. An operator console 128, such as a computer, allows a user to operate the imaging system 100. The operator console 128 includes one or more processors for executing computer readable instructions encoded on computer readable storage medium such as physical memory and/or other medium such as signal medium. The console 128 also includes an output device such as a monitor or display and an input device such as a keyboard and/or a mouse.

FIGS. 2 and 3 illustrate an example detector module 200 of the detector 120. FIG. 2 shows a view looking into a radiation receiving surface of the detector module 200, and FIG. 3 shows a side view along the depth of the detector module 200. The illustrated detector 120 includes a plurality of the detector modules 200. Each module 200 includes a 2D array of tiles 202, extending along a transaxial direction 204 and an axial direction 206. Each tile 202 includes an array of crystals 208.

As shown in FIG. 2, tiles 202 in adjacent columns 218 are shifted, with respect to each other, along the axial direction 206. In this example, the tiles are shifted by a half of tile or a full crystal, or about four millimeters (4 mm). In other embodiment, the tiles can be shifted by greater or lesser amounts. A pitch 212 (e.g., four millimeters (4 mm) in the illustrated embodiment) corresponds to a tile center to tile center distance between neighboring tiles 202 in adjacent columns 218. Neighboring tiles 202 and 202 in a same column 206 are shifted by a gap 214 (e.g., eight millimeters (8 mm) in the illustrated embodiment), and neighboring gaps 214 in adjacent columns 206 form a continuous region 216, which extends diagonally across the detector module 200, in the transaxial direction 204, between tiles 202. Such a configuration forms a spare arrangement of tiles 202.

An electrically conductive material 226 such a tin-copper alloy, copper or other electrically conductive material is located in the gap region 216 between the detector tiles 202. Bonding wires (not visible) interconnect the electrically conductive material 226 in successive gap regions 216. The interconnected conductive material 226 forms an electric field shield (e.g., a Faraday cage) that shields the tiles 202 from external electric fields, such as the high field generated by the MR portion 102 during scanning with the MR portion 102, and, thus, the influence such a high field has on the tiles 202. As such, the PET portion 104 can be used (e.g., for whole body or other PET scanning) in connection with the MR portion 102, without diminishing the sensitivity and spatial resolution of the PET detector 12. In addition, the sparse arrangement of the tiles 202 provides for additional space for the bonding between photo-sensors and detector electronics.

As briefly described above, the crystal array can be connected to the photo-sensors either through a light guide, directly (e.g., without use of a light guide) or otherwise, based on a sensitivity pattern of the photo-sensors structured such that the crystal identification is given by a unique ratio of the triggered channels. The latter allows for identifying n crystals using k channels (n-k encoding), where k<n, and, thus, only k readout channels on needed on the readout electronic. FIGS. 4, 5, 6, 7, 8, 9, 10, 11 and 12 schematically illustrate a sample of non-limiting example structured sensitivity or encoding patterns, and other patterns are also contemplated herein.

FIGS. 4-7 shows a one dimensional (1D) pattern using two (2) channels 402 and 404 to encode four (4) crystals 1, 2, 3 and 4.

The channel 402 is indicated by the cross hatch pattern, and the channel 404 is indicated by the dot pattern. Where each crystal is directly or closely coupled to the sensor array, the light that is emitted via a gamma crystal interaction will likely be highly located on the sensor-crystal interface. Thus, if a gamma interacts with crystal 1, only the channel 402 will detect it, if a gamma interacts with crystal 2 or crystal 3, both of the channels 402 and 404 will detect it, but with different percentages, and if a gamma interacts with crystal 4, only the channel 404 will detect it. Since the ratio of signal detected by each channel 402 and 404 is different for each of the crystals 1-4, the ratio is characteristic of the crystal position, while the sum of the detected signal of both channels 402 and 404 is the same for each of the crystals 1-4.

Figure 4:
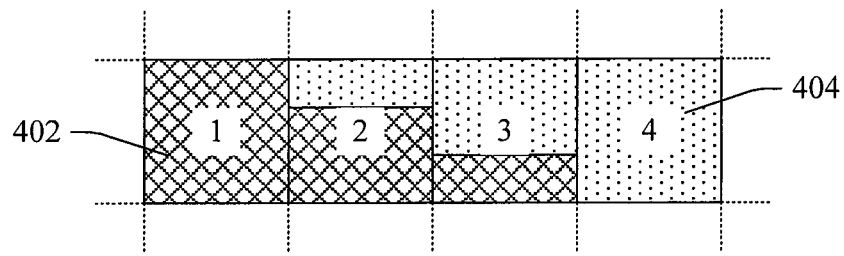
Figure 5:
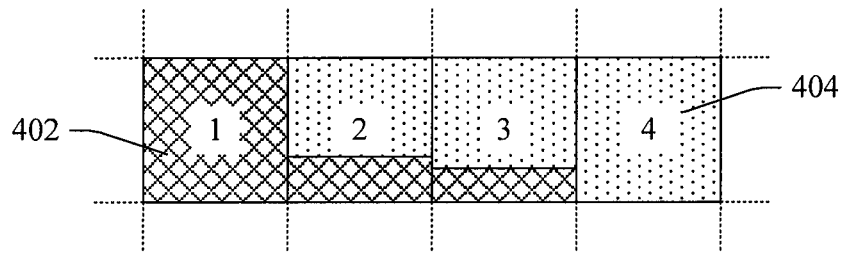
Figure 6:
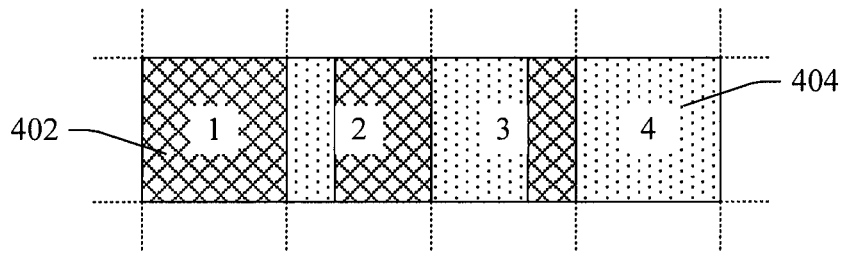
Figure 7:
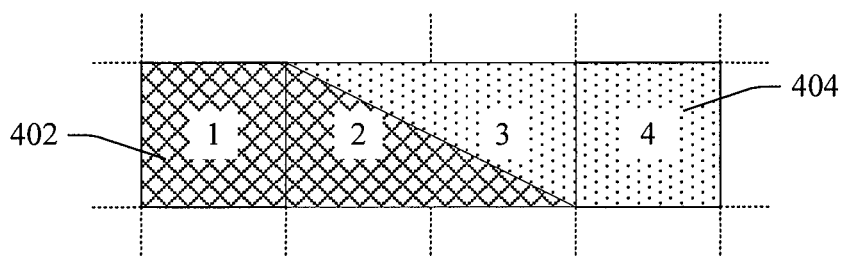

In FIG. 4, the patterns for the crystals 1-4 are linear in that the ratio of the channels changes by approximately 1/3 from crystal to crystal. Thus, if a gamma interacts with crystal 1, only the channel 402 will detect it, if a gamma interacts with crystal 2, both of the channels 402 and 404 will detect it with a ratio of 2/3 to channel 402 and 1/3 to channel 404, if a gamma interacts with crystal 3, both of the channels 402 and 404 will detect it with a ratio of 1/3 to channel 402 and 2/3 to channel 404, and if a gamma interacts with crystal 4, only the channel 404 will detect it. In other embodiments, the ratio can be non-linear such as the non-limiting variation shown in FIG. 5. Furthermore, in FIG. 6, the pattern for the crystals 1-4 are vertical. In FIG. 7, the step size of the pattern is small enough that the encoding pattern is quasi continuous.

Figure 8:
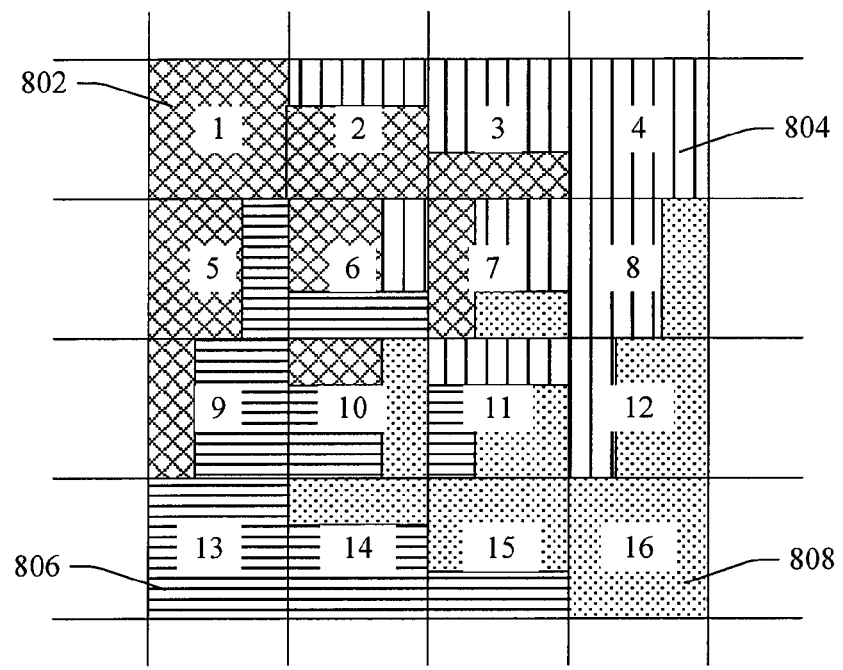

FIG. 8 shows a two-dimensional (2D) linear encoding pattern. In FIG. 8, four (4) channels 802 (indicated by cross hatch in the figure), 804 (indicated by squares in the figure), 806 (indicated by horizontal bars in the figure) and 808 (indicated by dots the figure) are used to encode sixteen (16) crystals 1-16. Table 1 summarizes the encoding for FIG. 8. It is to be appreciated that in other embodiments more or less channels can be used to encode more or less crystals.

TABLE 1

Example encoding for FIG. 8.

| Crystal position | Cross hatch (Channel 802) | Square (Channel 804) | Horizontal line (Channel 806) | Dots (Channel 808) |
|---|---|---|---|---|
| 1 | 1.0 | | | |
| 2 | 0.7 | 0.3 | | |
| 3 | 0.3 | 0.7 | | |
| 4 | | 1.0 | | |
| 5 | 0.7 | | 0.3 | |
| 6 | 0.5 | 0.2 | 0.3 | |
| 7 | 0.3 | 0.5 | | 0.2 |
| 8 | | 0.7 | | 0.3 |
| 9 | 0.3 | | 0.7 | |
| 10 | 0.2 | | 0.5 | 0.3 |
| 11 | | 0.3 | 0.2 | 0.5 |
| 12 | | 0.3 | | 0.7 |
| 13 | | | 1.0 | |
| 14 | | | 0.7 | 0.3 |
| 15 | | | 0.3 | 0.7 |
| 16 | | | | 1.0 |

Figure 9:
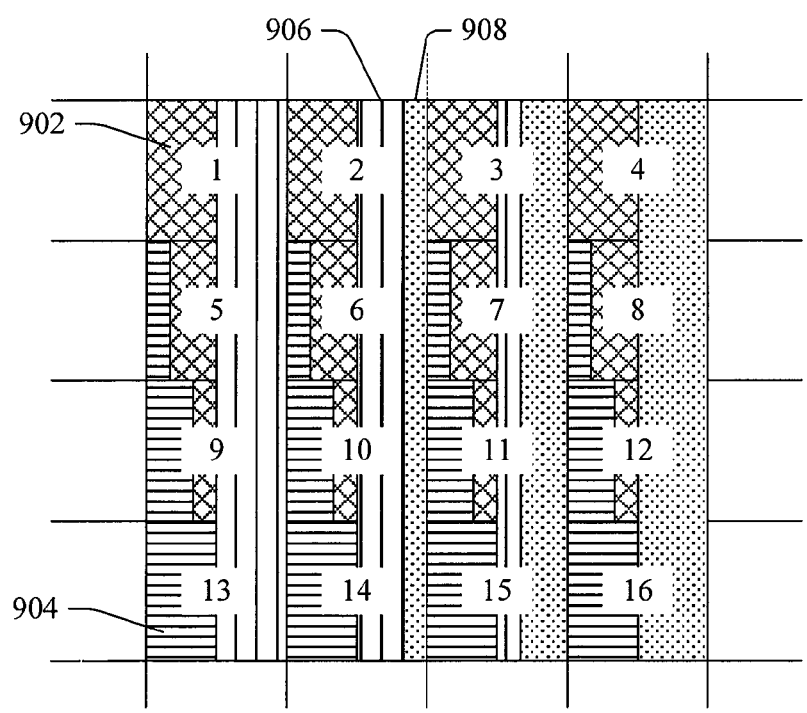

FIG. 9 shows two-dimensional (2D) encoding using linear basis functions in both the horizontal and the vertical directions (rectangular support) to encode sixteen (16) crystals, 1-16, using four (4) channels 902, 904, 906 and 908. In FIG. 9, the channels 902 and 904 provide vertical encoding, and the channels 906 and 908 provide concurrent horizontal encoding. Likewise, in other embodiments more or less channels can be used to encode more or less crystals. In this embodiment, all of the channels have a same geometrical area. In another embodiment, at least one of the channels has a different area.

Figure 10:
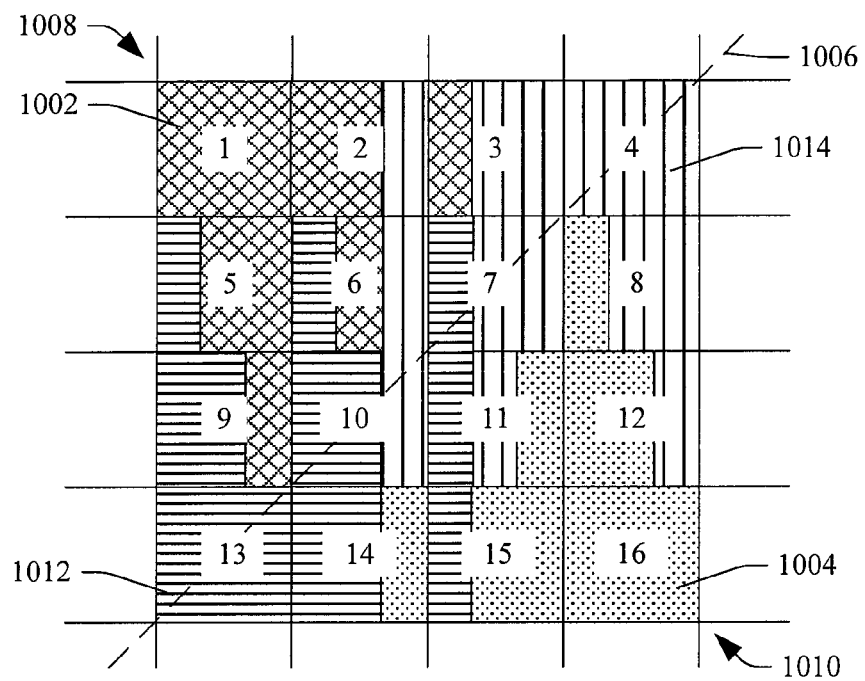

FIG. 10 shows two-dimensional (2D) four (4) channel to sixteen (16) crystal encoding using linear basis functions with triangular support in which the encoding with channels 1002 and 1004 decreases symmetrically in both the vertical and horizontal directions with respect to a diagonal 1006, which bisects the 2D array of crystals, forming two triangular regions 1008 and 1010. In this example, the channels 1002 and 1004 and the channels 1012 and 1014 do not have a same geometrical area, with the channels 1012 and 1014 having areas that are approximately equal and greater than the areas of the channels 1002 and 1004, which are also approximately equal.

Figure 11:
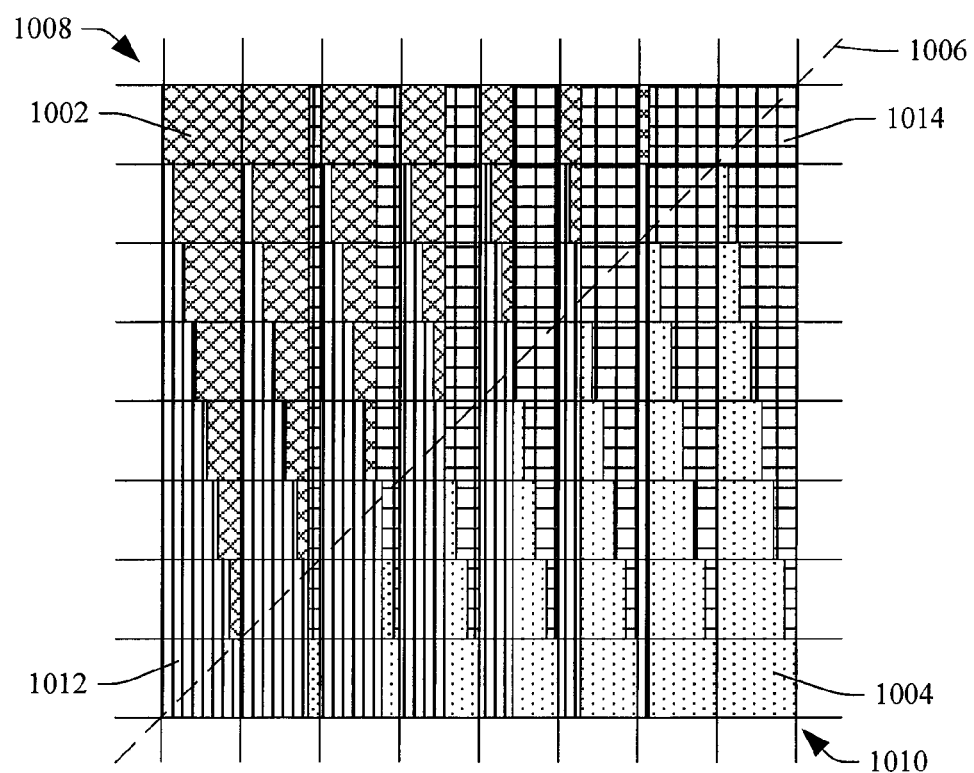

In FIG. 11, the channels 1002, 1004, 1012 and 1014 are employed to encode sixty-four (64) crystals using linear basis functions with triangular support with respect to the diagonal line 1006.

It is to be appreciated that the either or both dimensions of the 2D patterns of FIGS. 8-10 can alternatively have a pattern of one or more of the 1D patterns of FIGS. 4-7 and/or other encoding pattern.

Figure 12:
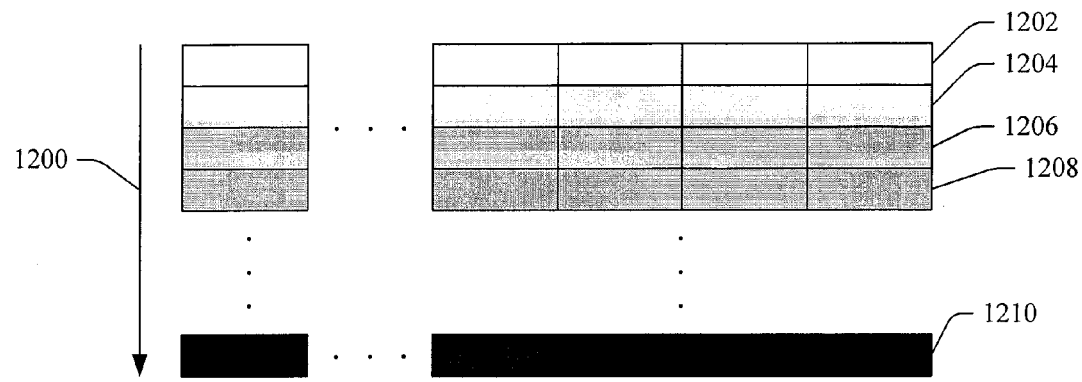

FIG. 12 shows an example of three-dimensional (3D) encoding. A side view, along a depth 1200, of an N×M (where N and M are integers) crystal configuration is shown. In this example, the array of crystals includes a plurality of layers 1202, 1204, 1206, 1208, . . . , 1210 stacked along the depth 1200. Each of the plurality of layers 1202-1210 may have a channel encoding pattern similar to one of the patterns discussed in connection with FIGS. 4-11 or other encoding pattern. The plurality of layers 1202-1210 also includes an encoding along the depth 1200. For explanatory purposes, an example depth encoding pattern is shown in FIG. 12 through different shades of gray. The depth encoding individually and uniquely identifies each of the plurality of layers 1202-1210, for example, concurrently with one or more of the encoding patterns of FIGS. 4-11.

It is to be understood that the encoding shown in FIGS. 4-12 is not limiting, and other encoding is also contemplated herein.

Figure 13:
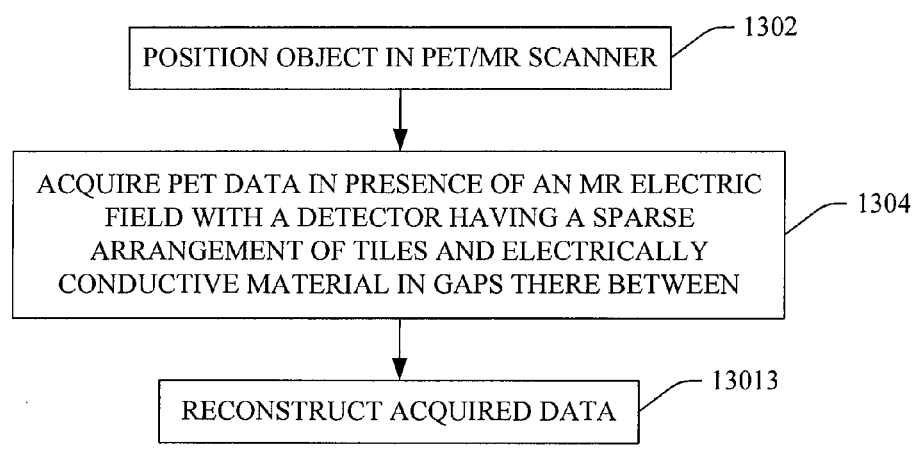
FIG. 13 illustrates an example method of imaging using a PET detector with shielding from external electric fields.

FIG. 13 illustrates a method.

It is to be appreciated that the ordering of the acts in the methods described herein is not limiting. As such, other orderings are contemplated herein. In addition, one or more acts may be omitted and/or one or more additional acts may be included.

At 1302, an object is positioned in an integrated PET/MR scanner.

At 1304, PET data is acquired, using a detector having a sparse tile arrangement and an electric field shield including an electrically conductive material located in spacing between tiles and interconnected, in a presence of a high field generated by a MR portion of the scanner. As described herein, such shielding mitigates the influence of the high field on the PET detector electronics, without diminishing the sensitivity and spatial resolution of the detector. In addition, the sparse arrangement provides for additional space for the bonding between photo-sensors and detector electronics.

At 1306, the acquired PET data is reconstructed.

Figure 14:
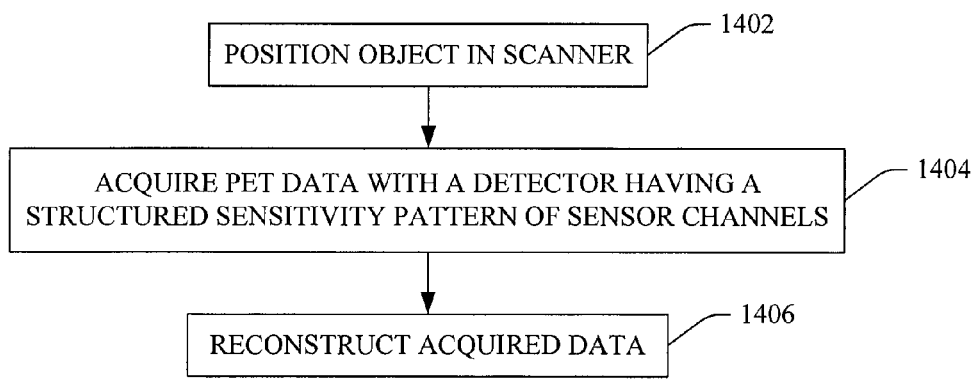
FIG. 14 illustrates an example method of imaging using a PET detector with a structured sensitivity pattern of the sensor channels.

FIG. 14 illustrates a method.

It is to be appreciated that the ordering of the acts in the methods described herein is not limiting. As such, other orderings are contemplated herein. In addition, one or more acts may be omitted and/or one or more additional acts may be included.

At 1402, an object is positioned in a PET or integrated PET/MR scanner.

At 1404, PET data is acquired with a detector having a structured sensitivity pattern of the photo-sensor channels. As described herein, the PET detector may include a crystal array that is coupled directly to the photo-sensors, without the use of a light guide, and, in such an embodiment, the sensitivity pattern of the photo-sensors can be structured such that the crystal identification is given by a unique ratio of the triggered channels. This allows for homogeneous crystal identification for PET across the detector block, even at the edges, and identifying n crystals using k channel (where k<n) and, thus, fewer (k) readout channels can be used on the readout electronic.

At 1406, the acquired PET data is reconstructed.

The above may be implemented via one or more processors executing one or more computer readable instructions encoded or embodied on computer readable storage medium such as physical memory which causes the one or more processors to carry out the various acts and/or other functions and/or acts. Additionally or alternatively, the one or more processors can execute instructions carried by transitory medium such as a signal or carrier wave.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. An imaging system, comprising:
a magnetic resonance portion that produces an electric field; and
a second imaging portion, the second imaging portion, including:
a positron emission tomography detector with a two dimensional array of detector tiles with rows and columns of tiles, each tile including a two dimensional array of scintillation crystals, wherein adjacent tiles along each column are spaced apart by a gap having a length on an order of a length of a tile with an electrically conductive material disposed in the gap, neighboring tiles along each row abut each other and are offset from each other in a same direction along the columns by a non-zero distance that is less than a length of a tile, and the electrically conductive material forms a continuous electrically conductive region that extends diagonally between tiles across columns, which shields the tiles from the electric field.

2. The imaging system of claim 1, wherein the non-zero distance is approximately a half a tile.

3. The imaging system claim 1, further comprising: electrically conductive contacts that electrically interconnect the electrically conductive regions along the axial direction.

4. The imaging system of claim 1, wherein the electrically conductive material includes a tin copper alloy.

5. The imaging system of claim 1, the detector comprising: the array of scintillation crystals; and a photo-sensor having a structured sensitivity pattern of sensor channels, wherein the crystals are coupled to the photo-sensor, and a unique ratio of triggered channels identifies each crystal.

6. The imaging system of claim 5, wherein the structured sensitivity pattern maps a first number of crystals to a second number of channels, wherein the second number is less than the first number.

7. An imaging system, comprising:
a first imaging portion having a detector, the detector including:
an array of scintillation crystals; and
a photo-sensor coupled to the array of scintillation crystals,
wherein an output of the photo-sensor includes a unique ratio of information that identifies each crystal, wherein the photo-sensor includes a structured sensitivity pattern that maps a first number of crystals to a second number, wherein the structured sensitivity pattern is a three dimensional pattern.

8. The imaging system of claim 7, wherein the second number is less than the first number.

9. The imaging system of claim 7, further comprising:
a magnetic resonance portion that produces an electric field, wherein the positron emission tomography portion and the magnetic resonance portion are integrated into a single scanner.

10. The imaging system of claim 9, the detector comprising:
a two dimensional an array detector tiles, wherein adjacent tiles along an axial direction are spaced apart by an electrically conductive material, which shields the tiles from the external electric field.

11. The imaging system of claim 10, wherein the neighboring tiles along a transaxial direction are offset from each other by a distance less than a tile.

12. The imaging system claim 10, wherein the electrically conductive material between the tiles form a continuous electrically conductive region across the detector in the trans axial direction.

13. The imaging system claim 12, further comprising:
electrically conductive contacts that electrically interconnect the electrically conductive regions along the axial direction.

14. The imaging system of claim 10, wherein the electrically conductive material includes a tin copper alloy.

* * * * *